(12) United States Patent
Chen et al.

(10) Patent No.: US 6,812,096 B2
(45) Date of Patent: Nov. 2, 2004

(54) METHOD FOR FABRICATION A FLASH MEMORY DEVICE HAVING SELF-ALIGNED CONTACT

(75) Inventors: Kuang-Chao Chen, Hsinchu (TW); Ling-Wuu Yang, Taichung (TW); Jui-Lin Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/248,713

(22) Filed: Feb. 12, 2003

(65) Prior Publication Data

US 2004/0147076 A1 Jul. 29, 2004

(30) Foreign Application Priority Data

Jan. 23, 2003 (TW) .......................... 92101439 A

(51) Int. Cl.[7] .................. H01L 21/336; H01L 21/3205
(52) U.S. Cl. .................. 438/257; 438/262; 438/593
(58) Field of Search .................. 438/257–267, 438/593, 599, FOR 203, 238, 253, 254, 256, 393, 394, 398, 399; 257/314–320, E21.179, E21.422, E21.68, E21.681, E21.683, E21.687, E21.688, E29.129, E29.3

(56) References Cited

U.S. PATENT DOCUMENTS 6,285,045 B1 * 9/2001 Itabashi et al. .............. 257/211
6,335,243 B1 * 1/2002 Choi et al. .................. 438/257
6,348,375 B1 * 2/2002 Lee et al. .................. 438/253

* cited by examiner

*Primary Examiner*—George Fourson
*Assistant Examiner*—Brook Kebede
(74) *Attorney, Agent, or Firm*—Jiang Chyun IP Office

(57) ABSTRACT

A flash memory device that comprises a self-aligned contact opening and a fabrication method thereof are described. Subsequent to the formation of the control gate of the flash memory device, a spacer is formed over a sidewall of the gate layer in a subsequent process, followed by forming another dielectric layer over the substrate to cover the control gate. Thereafter, the dielectric layer and the dielectric layer underlying the control gate are patterned to form a self-aligned contact opening between two neighboring control gates to expose a bit line in the substrate. A conductive material further fills the self-aligned contact opening.

15 Claims, 9 Drawing Sheets

METHOD FOR FABRICATION A FLASH MEMORY DEVICE HAVING SELF-ALIGNED CONTACT

CROSS REFERENCE TO RELATED APPLICATIONS

This application claims the priority benefit of Taiwan application serial no. 92101439, filed on Jan. 23, 2003.

BACKGROUND OF INVENTION

1. Field of Invention

The present invention relates to a semiconductor device that comprises a self-aligned contact and a fabrication method thereof. More particularly, the present invention relates to memory device that comprises a self-aligned contact and a fabrication method thereof.

2. Description of Related Art

The resolution in fabricating the current ultra large scale integrated (ULSI) circuit has already been developed to 0.18 microns and below. In other words, the larger the ratio of depth to line width or diameter, the contact of the semiconductor device and metal will become smaller. To overcome the continuous decrease in the line width and a misalignment of the contact is one important research and development effort that is being emphasized in the semiconductor industry.

To overcome the continuous decrease in the line width and the misalignment of the contact, semiconductor device normally employs the design of a self-aligned contact.

The conventional contact is formed between two neighboring gate structures and is in contact electrically with the source/drain regions in the substrate beside both sides of the gate structures.

However, the application of a self-aligned contact in a flash memory device has not yet been proposed. In other words, a self aligned contact is formed between two neighboring control gates, wherein the contact penetrates through the dielectric layer under the two control gates and electrically contacts with the bit line in the substrate in order to electrically connect the bit line to an external circuit.

SUMMARY OF INVENTION

Accordingly, the present invention provides a semiconductor device with a self-aligned contact and a fabrication method thereof, wherein the design of a self-aligned contact is applied to a flash memory device to electrically connect the bit line in the substrate to an external circuit.

The present invention further provides a semiconductor device with a self-aligned contact and a fabrication method thereof, wherein another application of a self-aligned contact is provided.

The present invention provides a semiconductor device with a self-aligned contact and a fabrication method thereof, wherein a plurality of first stacked layers is formed over a substrate, wherein each first stacked layer is formed with a first gate dielectric layer and a conductive layer. A cap layer is further formed over the conductive layer of the first stacked layer to protect the conductive layer. Bit lines are formed in the substrate beside two sides of each of the first stacked layers, followed by filling a first dielectric layer in between the first stacked layers. If the first stacked layers comprise a cap layer, the cap layer needs to be removed after the filling of the first dielectric layer. Thereafter, the conductive layer of the stacked layers is then patterned to a direction perpendicular to the direction of the bit lines to form a plurality of floating gates. A second dielectric layer then fills in between the floating gates. A second stacked layer is further formed above the floating gates of a same row, wherein each of the second stacked layer is formed with a thin dielectric layer, a control gate and a cap layer. Spacers are further formed on the sidewalls of the second stacked layers, followed by forming a third dielectric layer over the substrate to cover the second stacked layers. The etching rates of the spacer and the cap layer are lower than the etching rates of the third dielectric layer and the first dielectric layer. Thereafter, the third dielectric layer and the first dielectric layer are patterned to form a self-aligned contact opening between two neighboring second stacked layers, exposing the corresponding bit line. A first conductive material then fills the self-aligned contact opening to form a self-aligned contact, wherein the self-aligned contact is formed between two neighboring second stacked layers. Further, the self- aligned contact penetrates through the third dielectric layer above the second stacked layers and the first dielectric layer to electrically contact with the bit line.

The present invention provides a fabrication method for a semiconductor device with a self-aligned contact, wherein a substrate with a conductive structure already formed thereon is provided. The conductive structure is formed over a first dielectric layer, followed by forming a plurality of gate structures above the first dielectric layer, wherein each gate structure is formed with a dielectric thin layer, a gate conductive layer and a cap layer. A spacer is further formed on the sidewall of each gate structure. Thereafter, a second dielectric layer is formed over the substrate, covering the gate structure. The second dielectric layer and the first dielectric layer are then patterned to form a self-aligned contact opening between two neighboring gate structures, wherein the self-aligned contact opening exposes the conductive structure under the first dielectric layer. The self-aligned contact opening is then filled with a conductive material to form a self-aligned contact.

The present invention provides a semiconductor device that comprises a self-aligned contact, wherein this device includes a first dielectric layer, a plurality of gate structures, a spacer, a second dielectric layer and a self-aligned contact. The first dielectric layer is disposed above a substrate, and the gate structures are disposed above the first dielectric layer, wherein each gate structure comprises a dielectric thin layer, a gate conductive layer and a cap layer. A spacer is disposed on a sidewall of each gate structure. Further, the second dielectric layer is disposed to cover the first dielectric layer and the gate structures. The self-aligned contact is positioned in the first and second dielectric layers between two neighboring gate structures. In other words, the self-aligned contact is positioned between two neighboring gate structures and is penetrated through the second dielectric layer above the gate structure and the first dielectric layer.

The self-aligned contact of the present invention is formed between two neighboring gate structures and is penetrated through the dielectric layer that is underneath and in between two neighboring gate structures to electrically contact with the conductive structure under the dielectric layer. The present invention provides a self-aligned contact with a structure that is different from that in the prior art. Further, the self-aligned contact of the present invention is applicable in flash memory devices.

It is to be understood that both the foregoing general description and the following detailed description are exemplary, and are intended to provide further explanation of the invention as claimed.

BRIEF DESCRIPTION OF DRAWINGS

FIGS. 6A to 6C are cross-sectional views of FIG. 6 along the cutting lines A–A", B–B" and C–C", respectively;

FIGS. 7A to 7C are cross-sectional views of FIG. 7 along the cutting lines A–A", B–B" and C–C", respectively.

DETAILED DESCRIPTION

FIGS. 1 to 7 are schematic, top view diagrams illustrating the fabrication process of a memory device that comprises a self-aligned contact according to one aspect of the present invention.

Figure 1:
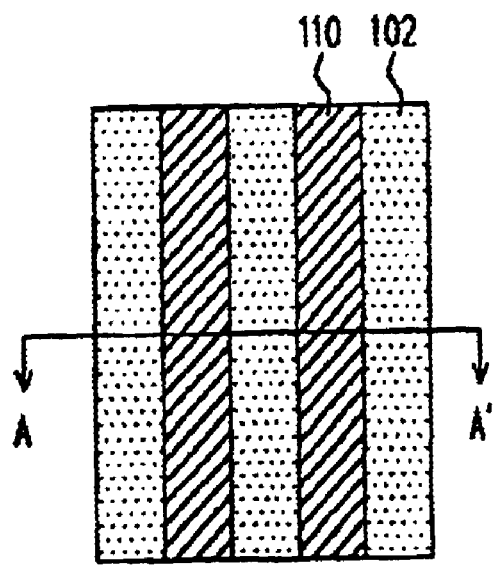
FIG. 1A is a cross-sectional view of FIG. 1 along the cutting line 1A–1A'.
Figure 1A:
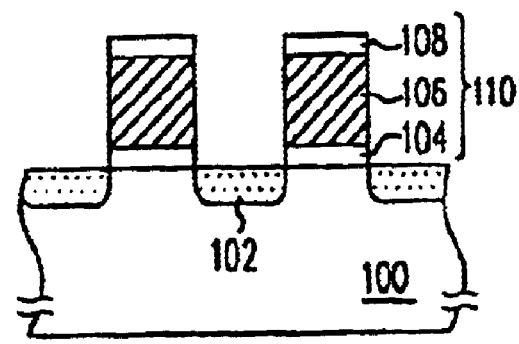

Referring to FIGS. 1 and 1A, a plurality of strip-shaped stacked layers 110 is formed over a substrate 100, wherein each stacked layer 110 is formed with a dielectric layer 104, a conductive layer 106 and a cap layer 108. In one aspect of the present invention, the gate dielectric layer 104 is formed with, for example, silicon oxide and the conductive layer 106 is formed with, for example, polysilicon, while the cap layer 108 is formed with, for example, silicon nitride.

Using the stacked layers 110 as an implantation mask, an ion implantation is performed to form bit lines 102 in the substrate 100 beside both sides of each stacked layer 110.

Figure 2:
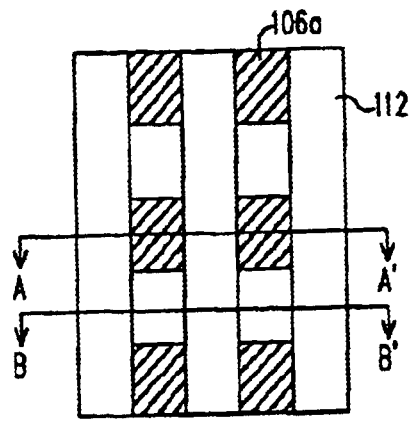
FIGS. 2A and 2B are cross-sectional views of FIG. 2 along the cutting lines 2A–2A' and 2B–2B', respectively.
Figure 2A:
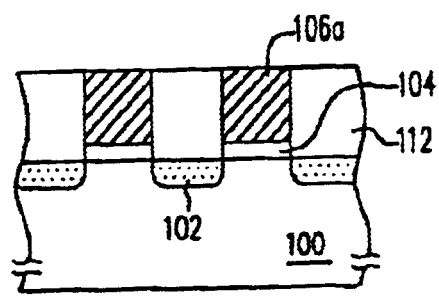
Figure 2B:
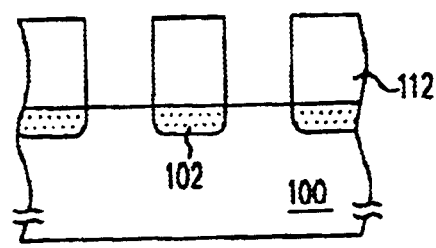

Thereafter, as shown in FIGS. 2, 2A and 2B, a dielectric layer 112 is formed over the substrate 100 filling in between the stacked layers 110, wherein the dielectric layer 112 is formed with, for example, silicon oxide. The dielectric layer 112 is formed by, for example, depositing a dielectric material layer (not shown) to cover the stacked layers 110, followed by performing chemical mechanical polishing or etching back to planarize the dielectric material layer until the cap layer 108 of the stacked layer 110 is removed to expose the conductive layer 106.

The conductive layer 106 is then patterned along a direction perpendicular to that of the bit line 102 to form a plurality of floating gates 106a.

Figure 3:
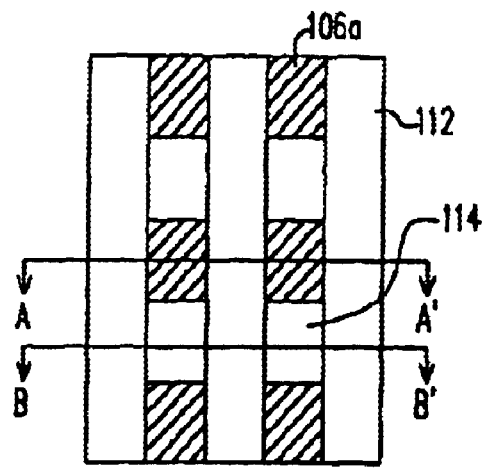
FIGS. 3A to 3B are cross-sectional views of FIG. 3 along the cutting lines 3A–3A' and 3B–3B', respectively.
Figure 3A:
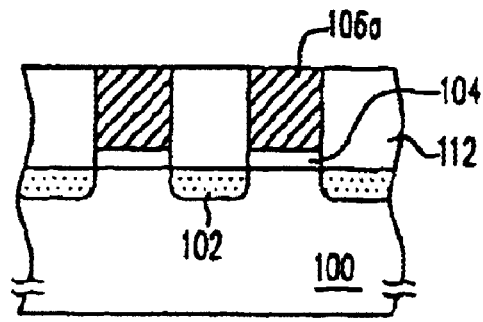
Figure 3B:
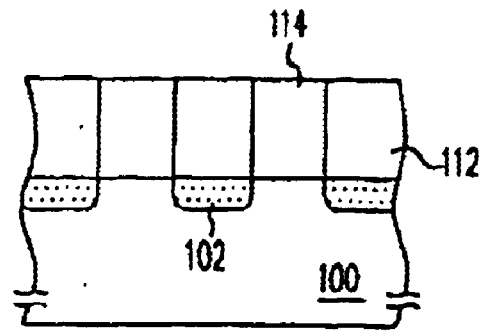
Figure 4:
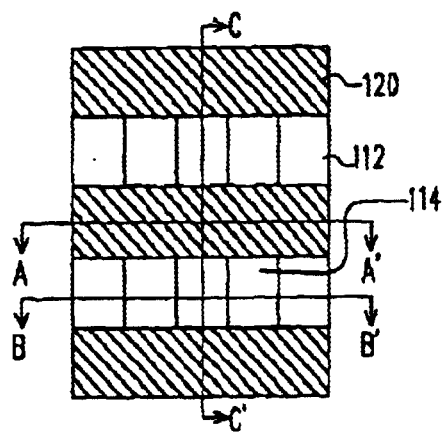
FIGS. 4A to 4C are cross-sectional views of FIG. 4 along the cutting lines 4A–4A', 4B–4B' and 4C–4C', respectively.
Figure 4A:
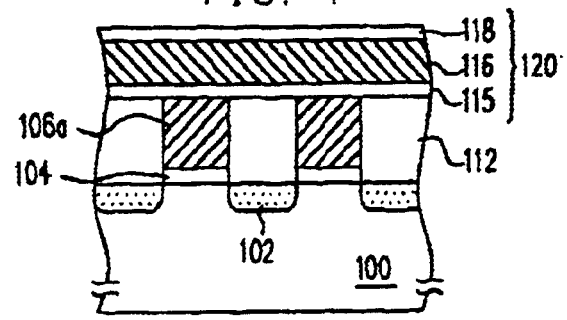
Figure 4B:
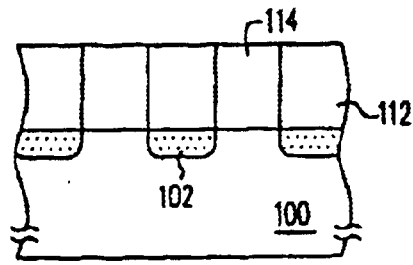
Figure 4C:
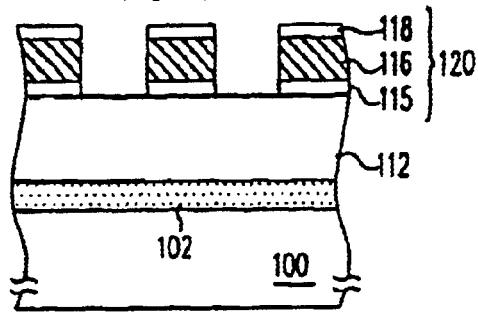
Figure 5:
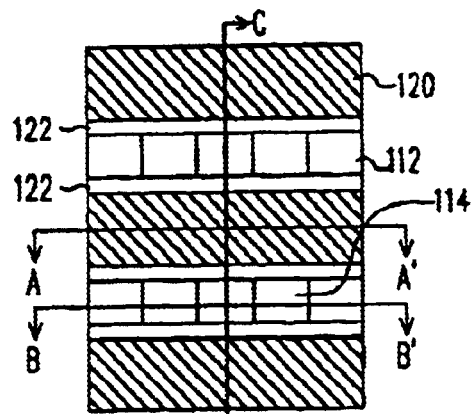
FIGS. 5A to 5C art cross-sectional views of FIG. 5 along the cutting lines 5A–5A', 5B–5B' and 5C–5C', respectively.
Figure 5A:
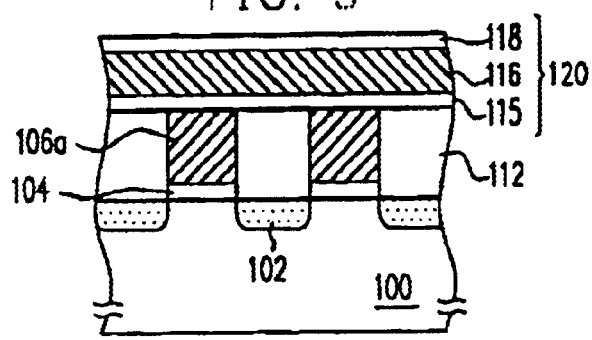
Figure 5B:
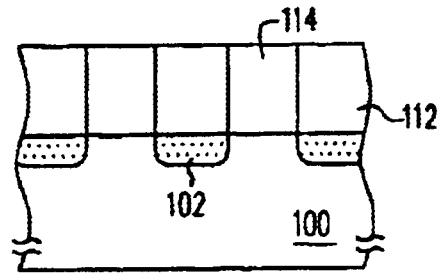
Figure 5C:
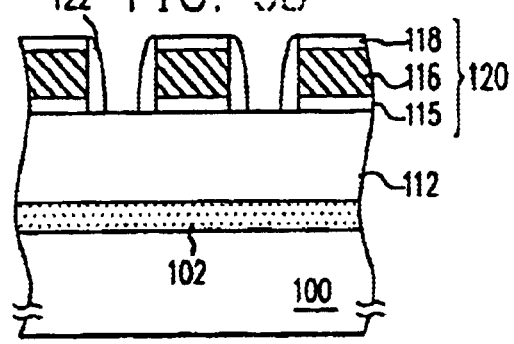
Figure 6:
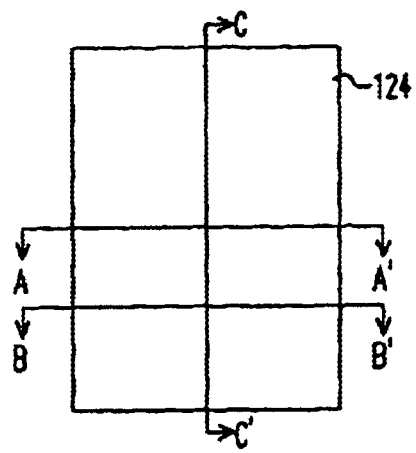
FIGS. 6A to 6C are cross-sectional views of FIG. 6 along the cutting lines 6A–6A', 6B–6B' and 6C–6C', respectively.
Figure 6A:
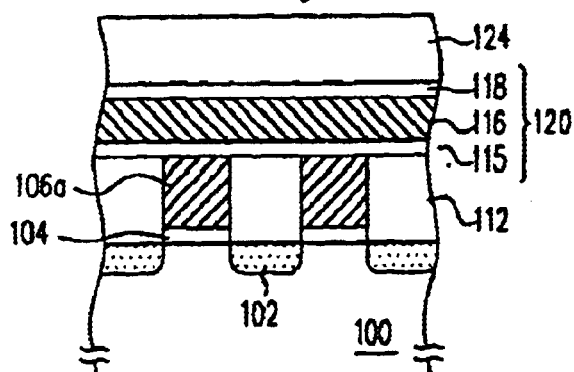
Figure 6B:
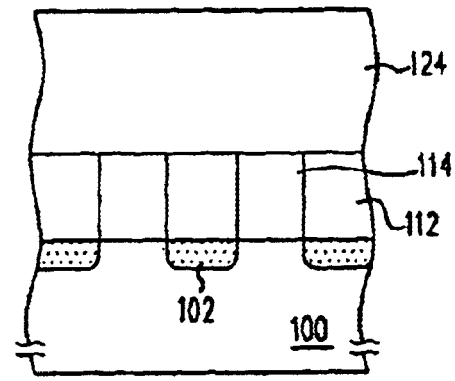
Figure 6C:
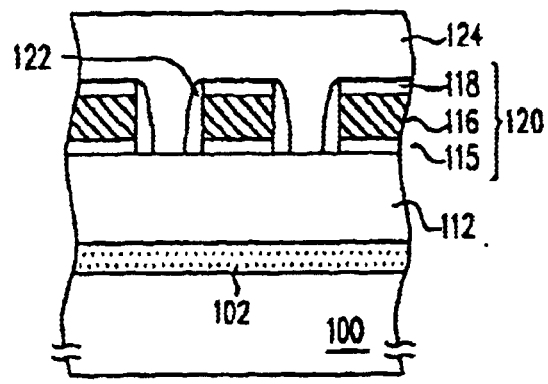

Referring to FIGS. 3, 3A and 3B, a dielectric layer 114 fills in between the floating gates 106a. The dielectric layer 114 is formed with a material, such as, silicon nitride, by a method, for example, depositing a dielectric material layer (not shown) to cover the stacked layers 110 followed by using chemical mechanical polishing or etching back to planarize the dielectric material layer until the floating gates 106a and the dielectric layer 112 are exposed.

Continuing to FIGS. 4, 4A, 4B and 4C, a strip-shaped stacked layer 120 is formed above the floating gates 106a of a same row, wherein the stacked layer 120 is formed with a dielectric thin layer 115, a control gate 116 and a cap layer 118. In one aspect of the present invention, the dielectric thin film layer 115 is, for example, a silicon nitride layer, a silicon oxide/silicon nitride (ON) layer or a silicon oxide/silicon nitride/silicon oxide (ONO) stacked layer, the control gate 116 is, for example, a polysilicon layer or a stacked layer of polysilicon and silicide, and a material for the cap layer includes, for example, silicon nitride.

Thereafter, as shown in FIGS. 5, 5A, 5B and 5C, a spacer 122 is formed over two sides of the stacked layer 120, wherein the spacer 122 is formed with, for example, silicon nitride. Forming the spacer 122 includes forming a conformal material layer (not shown) over the above structures, followed by etching back the conformal material layer to form the spacer 122 on the sidewall of the stacked layer 120.

Referring to FIGS. 6, 6A, 6B and 6C, a dielectric layer 124 is formed over the substrate 100, covering the stacked layers 120, wherein the dielectric layer 124 is, for example, silicon oxide.

Thereafter, as shown in FIGS. 7, 7A, 7B and 7C, a patterned photoresist layer 125 is formed over the dielectric layer 124 to expose a pre-determined region for the self-aligned contact. An etching process is performed to remove the dielectric layer 124 and the dielectric layer 112 that is not covered by the photoresist layer 125 to form a self-aligned contact opening 126 that exposes the bit line 102. The opening 126 is formed between two neighboring stacked layers 120. Further relied on the lower etching rates of the cap layer and the spacer 122 and the higher etching rates of the dielectric layer 124 and dielectric layer 112, the cap layer 18 and the spacer 122 protects the control gate 116 and the dielectric thin film layer 115 from being eroded in this etching process. The dimension of the opening pattern of the photoresist layer 125 can thus form a little bigger. Further, the opening 126 is formed self-aligned between two neighboring stacked layers 120. The opening 126 is therefore a self-aligned contact opening.

Figure 7:
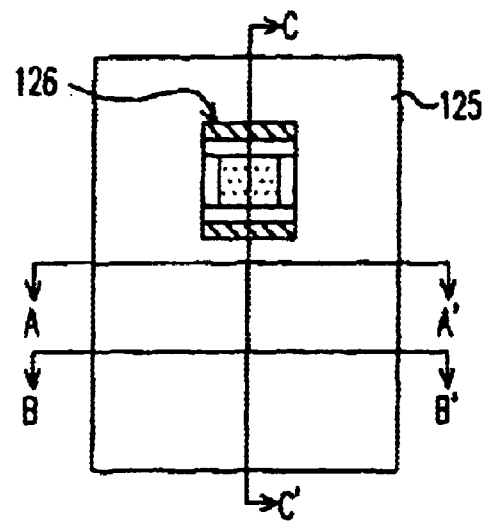
FIGS. 7A to 7C are cross-sectional views of FIG. 7 along the cutting lines 7A–7A', 7B–7B' and 7C–7C', respectively.
Figure 7A:
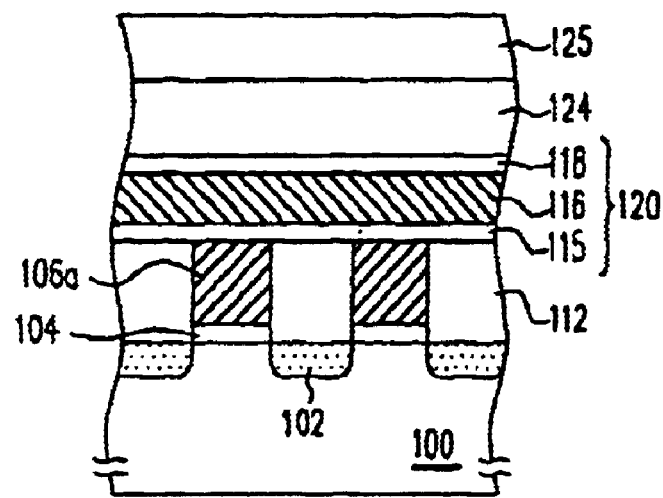
Figure 7B:
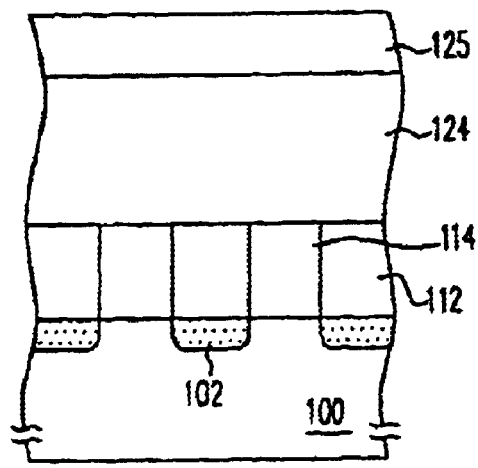
Figure 7C:
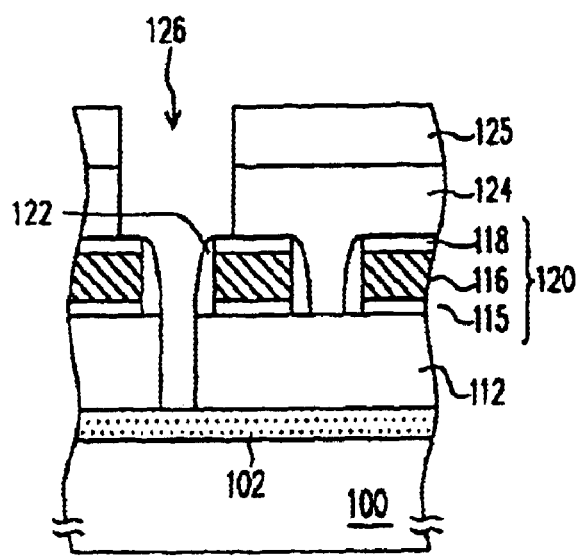
Figure 8:
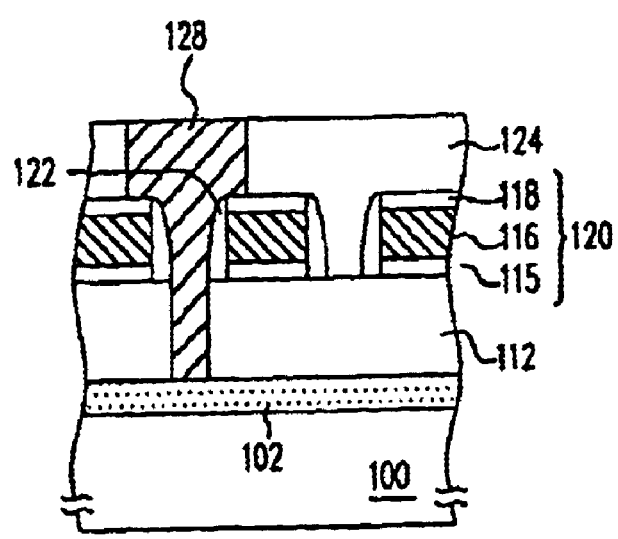
FIG. 8 is a cross-sectional view of FIG. 7 along the cutting lines C–C", respectively.

Referring to FIG. 8, FIG. 8 is a cross-sectional view diagram subsequent to the process step shown in FIG. 7C. A conductive material fills the opening 126 to form a self-aligned contact 128. Therefore, the self-aligned contact 128 is formed between two neighboring stacked layers 120, wherein the self-aligned contact penetrates through the dielectric layer 124 above the stacked layer and the dielectric layer 112 under the two stacked layers 120 to contact electrically with the underlying bit line 102. The bit line 102 can thus electrically connect to the external circuit.

The flash memory device of the present invention comprises a substrate 100, bit lines 102, a gate dielectric layer 104, floating gates 106a, a dielectric layer 112, a dielectric thin film layer 115, a control gate 116, a cap layer 118, a spacer 122, a dielectric layer 124 and a self-aligned contact 128.

The bit lines 102 are located in the substrate 100, wherein the floating gates 106a are disposed on the substrate 100 between the bit lines 102. The gate dielectric layer 104 is disposed between the substrate 100 and the floating gates 106a.

The dielectric layer 112 is formed above the substrate 100 between the floating gates 106a. Further the dielectric thin layer 115, the control gate 116 and the cap layer 118 are stacked above a same row of floating gates 106a. Further the dielectric thin layer 115, the control gate 116 and the cap layer 118 are extended in a direction that is perpendicular to the direction of the bit line 102.

The dielectric layer 124 is disposed above the substrate 100 to cover the cap layer 118 and the dielectric layer 112.

The self-aligned contact 128 is positioned in the dielectric layer 124 and the dielectric layer 112 between two neighboring control gates 116 to electrically contact with the bit line 102. In other words, the self-aligned contact 128 is positioned between two neighboring control gates 116 and penetrates through the dielectric layer 124 above two control gates 116 and the dielectric layer 112 under the two control gates to electrically contact with the underlying bit line 102.

Although in the above embodiment, the self-aligned contact of the present invention has been described with respect to a flash memory device, the self-aligned contact of the present invention is applicable to other types of semiconductor device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a flash memory device that comprises a self-aligned contact, the method comprising:

forming a plurality of first stacked layers over a substrate, wherein each of the plurality of first stacked layers is formed with a gate dielectric layer and a conductive layer;

forming bit lines in the substrate beside both sides of each of the plurality of first stacked layers;

filling a first dielectric layer in between the plurality of first stacked layers;

patterning the conductive layer of the plurality of first stacked layers in a direction perpendicular to a direction of the bit lines to form a plurality of floating gates in a plurality of rows;

filling a second dielectric layer in between the plurality of floating gates;

forming second stacked layers over the plurality of floating gates of a same row, wherein each second stacked layers is formed with a dielectric thin layer, a control gate and cap layer;

forming a spacer on a side wall of each second stacked layers;

forming a third dielectric layer over the substrate, covering the second stacked layers;

patterning the third dielectric layer and the first dielectric layer to form a self-aligned contact opening between two neighboring second stacked layers to expose some of the bit lines; and filling a conductive material in the self-aligned contact opening.

2. The method of claim 1, wherein each of the plurality of first stacked layers is formed with a gate oxide layer and a polysilicon layer.

3. The method of claim 1, wherein a cap layer is further formed over the conductive layer of each of the plurality of first stacked layers.

4. The method of claim 3, wherein subsequent to filling in between the plurality of first stacked layers with the first dielectric layer, the cap layer is removed.

5. The method of claim 1, wherein the first dielectric layer is formed with a material that comprises silicon oxide.

6. The method of claim 1, wherein the second dielectric layer is formed with a material that comprises silicon nitride.

7. The method of claim 1, wherein the third dielectric layer is formed with a material that comprises silicon oxide.

8. The method of claim 1, wherein the dielectric thin layer of each of the second stacked layers is formed with a silicon nitride layer, a silicon oxide-silicon nitride (ON) layer or a silicon oxide-silicon nitride-silicon oxide layer.

9. The method of claim 1, wherein the control gate of each of the second stacked layers is formed with a polysilicon layer and a silicide layer.

10. The method of claim 1, wherein the cap layer is formed with a silicon nitride material.

11. The method of claim 1, wherein the spacer is formed with a silicon nitride material.

12. A fabrication method for a semiconductor device that comprises a self-aligned contact, the method comprising:

providing a substrate, wherein a conductive struck is already formed over the substrate, and a first dielectric layer is formed over the conductive structure;

forming a plurality of gate structures over the first dielectric layer, wherein each of the plurality of gate structures is formed with a dielectric thin layer, a gate conductive layer and a cap layer;

forming a spacer over a sidewall of each of the plurality of gate structures;

forming a second dielectric layer over the substrate to cover the plurality of gate structures;

patterning the second dielectric layer and the first dielectric layer to form a self-aligned contact opening between two of the neighboring plurality of gate structures to expose the conductive structure; and filling a conductive material in the self-aligned contact opening.

13. The method of claim 12, wherein etching rates of the spacer and the cap layer are lower than etching rates of the first dielectric layer and the second dielectric layer.

14. The method of claim 13, wherein the first dielectric layer and the second dielectric layer are formed with a material that includes silicon oxide.

15. The method of claim 13, wherein the spacer and the cap layer are formed with a material that includes silicon nitride.

* * * * *